US007522458B2

(12) United States Patent
Sunaga et al.

(10) Patent No.: US 7,522,458 B2

(45) Date of Patent: Apr. 21, 2009

(54) MEMORY AND METHOD OF CONTROLLING ACCESS TO MEMORY

(75) Inventors: Toshio Sunaga, Ohtsu (JP); Hisatada Miyatake, Ohtsu (JP)

(73) Assignee: International Business Machines Corporation, Armonk, NY (US)

(*) Notice: Subject to any disclaimer, the term of this patent is extended or adjusted under 35 U.S.C. 154(b) by 272 days.

(21) Appl. No.: 11/535,703

(22) Filed: Sep. 27, 2006

(65) Prior Publication Data

US 2007/0070799 A1 Mar. 29, 2007

(30) Foreign Application Priority Data

Sep. 28, 2005 (JP) ............................ 2005-281687

(51) Int. Cl.
*G11C 7/00* (2006.01)

(52) U.S. Cl. ........................ 365/191; 365/219; 365/233

(58) Field of Classification Search ............ 365/189.01, 365/189.05, 191 O, 219 X, 230.01, 233 X, 365/191, 219, 233

See application file for complete search history.

(56) References Cited

U.S. PATENT DOCUMENTS 6,252,794 B1 6/2001 Sunaga
6,847,570 B2 * 1/2005 Fujioka et al. .............. 365/222

FOREIGN PATENT DOCUMENTS

| | | |
|---|---|---|
| JP | PUPA10-111828 | 4/1998 |
| JP | PUPA2001-243764 | 9/2001 |
| JP | PUPA2002-358783 | 12/2002 |
| JP | PUPA2004-005780 | 1/2004 |
| JP | PUPA2006-12374 | 12/2006 |
| WO | WO2004/070786 | 8/2004 |
| WO | WO2007/013491 | 2/2007 |

* cited by examiner

*Primary Examiner*—VanThu Nguyen
(74) *Attorney, Agent, or Firm*—W. Riyon Harding

(57) ABSTRACT

A memory including at least one memory cell array and an access control circuit for controlling access to the memory array. The access control circuit includes an access command circuit (ADRCTL) that receives a first (CE) and a second (ADV) input signals and outputs an access command signal (ACMDS) enabling commencement of memory access, and a command discriminating circuit (CMDDEC) that receives the first (CE) and second (ADV) input signals, a third (OE) and a fourth (WE) input signals, and a clock signal (CLK), and that outputs a command discriminating signal (WRITE) for specifying whether the access command signal is for a read operation or a write operation.

17 Claims, 9 Drawing Sheets

| WE | OE | WRITE |
|---|---|---|
| L | L | SAME AS PREVIOUS STATE |
| L | H | L |
| H | L | H |
| H | H | H |

MEMORY AND METHOD OF CONTROLLING ACCESS TO MEMORY

CROSS REFERENCE TO RELATED APPLICATIONS

This applications claims priority to Japanese patent application 2005-281687 and is related to Japanese Patent No. 3362775 (corresponding to U.S. Pat. No. 6,252,794), herein incorporated by reference.

FIELD OF THE INVENTION

The present invention generally relates to memory devices and more particularly, relates to access control technique for memory devices, which improves data rate at data input/output (I/O) of memory devices.

BACKGROUND ART

Pseudo SRAM (PSRAM) which is based on DRAM has long been widely used in battery-driven products, such as cell phones and PDAs, particularly in products which require a large amount of memory capacity and thus are difficult to be realized with conventional SRAM. It is important for PSRAM not only to have a large memory capacity but also to achieve reduction in electric current in both standby and active modes. Furthermore, along with improvements in functions and performance of apparatuses in which PSRAM is to be used, it has become important in recent years for PSRAM to achieve increase in speed. For example, in an asynchronous system with conventional interface using SRAM, page mode with cycle time as short as 15 ns-20 ns is used. In order to achieve further increase in speed, in synchronous systems, products capable of performing writes and reads in 4-, 8-, and 16-word burst modes with a clock of 75 MHz and above 100 MHz have started to emerge. As a result, PSRAMs are advancing to be products encompasing more SDRAM-like qualities than SRAMs.

In standard PSRAM specifications (e.g., COSMORAM and Cellular RAM), the data rate of each burst of writes or reads in burst mode is high. However, in burst modes, a subsequent write or read command cannot be entered until after each burst ends. Therefore, when consecutive burst writes or reads of 4-, 8-, and 16-words are performed, an interval occurs between bursts on data bus. As a result, the data rate for consecutive burst operations becomes considerably lower than the maximum data rate which is determined by the clock being used.

FIGS. 1A and 1B are timing charts showing the operations of 4-word burst length in conventional PSRAM. FIGS. 1A and 1B show an example of the case in which the write latency is 4 and the read latency is 5 which are based on standard specifications. FIG. 1A shows two consecutive burst write operations. An address (ADR) is provided at a clock (CLK) timing (t1) at which the chip enabling (CE) signal, the address valid (ADV) signal, and the write enabling (WE) signal are low and the output enabling (OE) signal is high, so the first write command is entered. Then, from the fourth clock (t2) after that timing, 4-word burst data is provided to the data I/O. ATC represents an array time constant which indicates the time interval from the time point when word lines in the memory array start to be activated (high) to the time point when the operation of the memory array ends (bit lines are equalized). In pipeline systems such as used in SDRAM, the memory array is kept activated during the burst. Thus, until after the 4-word write completes, the subsequent write command cannot be entered. Accordingly, the subsequent write command is entered at the third clock (t3) from the last clock of the burst.

FIG. 1B shows two consecutive burst read operations. An address (ADR) is provided at a clock timing (t4) at which CE, ADV, and OE signals are low and the WE signal is high, so the first read command is entered. Then, from the fifth clock (t5), 4-word data are outputted to the data I/O. As with the write shown in FIG. 1A, in the pipeline operation, the memory array is kept activated until the last burst data is outputted. Accordingly, the subsequent read command cannot be entered until after the activated memory array is restored. Therefore, the subsequent read command is entered at the second clock (t6) from the clock of the last burst data. In the conventional PSRAM shown in FIGS. 1A and 1B, in both write and read, 6 clock interval (t1) occurs between bursts at the data I/O. That is, the data I/O repeats, for each burst operation, the operation of conveying consecutive data corresponding to four clocks and then no acitivies for six clocks. Thus, the data rate for the consecutive bursts is only 40% of the maximum data rate that is determined by the clock.

As a method of increasing the burst data rate, there is a general method as used in SDRAMs in which by providing a plurality of banks, seamlessness is achieved between bursts by bank interleaving. This method, however, has a problem that when consecutive accesses are made to an identical bank, seamlessness cannot be achieved.

A method that solves such problems is disclosed in Japanese Patent Publication No. 3362775 (corresponding to U.S. Pat. No. 6,252,794) assigned to the present assignee and herein incorporated by reference. This publication proposes a method that allows a seamless operation in all random row accesses including accesses to an identical bank. According to the method, during a write operation, burst data are sequentially latched (preloaded) and when all burst data are latched, all burst data are written to the memory cell array at the same time. During a read operation, all burst data are prefetched in a set of latches at a time after the sense amplifiers are first activated. The method employs a scheme in which activation of the array is done only for a single burst and precharging is performed immediately after the burst for both the read and write operations.

However, even if the method disclosed in the '794 patent is used, the following problem remains. Standard specifications define the aforementioned timings as shown in FIGS. 1A and 1B, and the second and subsequent write or read commands are specified to be entered at a time when the last burst ends. Therefore, as long as the standard command input scheme is used, even if the preload and prefetch scheme described in the aforementioned patent is used, the seamless input and output of consecutive burst data cannot be achieved. In other words, the data rate for consecutive bursts cannot be improved. Hence, a novel method is required that enables seamless operations without violating standard specifications as well as the operations conforming to the specifications.

SUMMARY OF THE INVENTION

The object of the present invention is to improve the data burst rate of contiguous burst data at data I/O in memory devices.

The object of the present invention is to make it possible to repeatedly execute seamless burst operations in memory devices.

The object of the present invention is to propose a novel method of controlling accesses to memory devices (access command scheme) without contradiction to standard specifications in the memory art.

According to one aspect of the present invention, a memory device is provided which comprises: at least one memory cell array; and an access control circuit for controlling access to the memory cell array or arrays, wherein the access control circuit comprises: an access command circuit that receives a first and a second input signals and outputs an access command signal enabling commencement of memory access; and a command discriminating circuit that receives the first and second input signals, a third and a fourth input signals, and a clock signal, and that outputs a command discriminating signal for specifying a read or write access command signal.

According to another aspect of the present invention, there is provided a memory device provided with at least a memory cell array, column decoders, and row decoders, and connected to a set of address inputs and a set of data inputs/outputs, which comprises: an access command circuit that receives a first and a second input signals and outputs an access command signal informing of commencement of accessing the memory; a command discriminating circuit that receives the first and second input signals, a third and a fourth input signals, and a clock signal, and that outputs a command discriminating signal for specifying a read or write access command signal; address latching circuits that, according to the access command signal, latch address signals inputted through the address inputs; access address latching circuits that receive the address signals outputted from the address latching circuits and output an access address to be actually accessed to the column decoders and the row decoders; prefetch latching circuits that latch read data read out of the memory cell array; preload latching circuits that latch write-data inputted through the data inputs/outputs; and a control circuit that receives the access command signal and the command discriminating signal and outputs an access start signal for accessing the access address of the memory cell array and to the access address latching circuits.

According to still another aspect of the present invention, there is provided a control method of controlling access to a memory, which comprises the steps of: generating an access command (ACMDS) signal for informing of the access to the memory according to a chip enabling (CE) signal and an address valid (ADV) signal; and generating a command discriminating (CDN) signal for specifying a read or a write access command signal according to the CE signal, the ADV signal, an output enabling (OE) signal, and a write-enabling (WE) signal.

According to the present invention, by adopting a novel method of controlling access to a memory device (access command scheme), the data rate at data input/output in burst modes can be improved.

In accordance with the present invention, by the adoption of a novel method of controlling access to a memory device (access command scheme) without contradiction to standard specifications in the memory art, it is possible to enable wide range of memory devices in a more general manner to execute seamless repetition of burst operations (improvement in the data rate) in memory devices without adherence to kinds of standard memory specifications.

DETAILED DESCRIPTION OF THE INVENTION

Figure 1A:
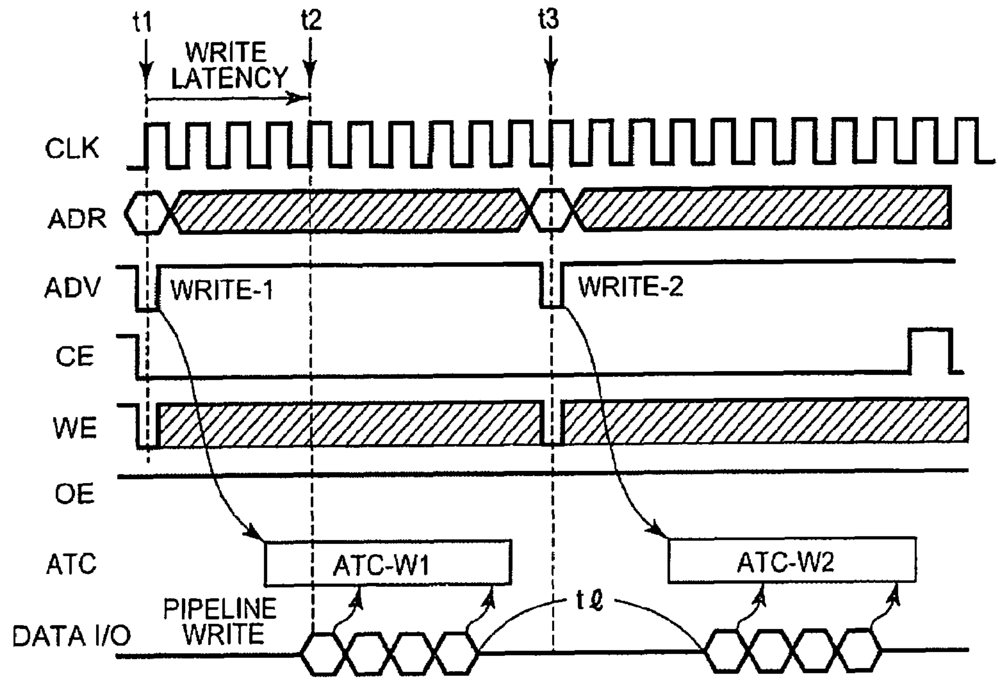
FIGS. 1A and 1B are timing charts showing operation in conventional PSRAM.

A memory device and a method of controlling access to memory devices of the present invention will be described with reference to the drawings. In the following description, to clarify the content of the present invention, the description referrs to the conventional examples (shown in the drawings), where necessary. In addition, although the following describe the case in which the present invention is applied to PSRAM, the present invention is not limited to PSRAM and is applicable to other memory systems. FIGS. 2A and 2B are timing charts of PSRAM which is an exemplary memory device of the present invention. FIGS. 2A and 2B show an exemplary case in which a preload/prefetch system is used with the same latency (write: 4 and read: 5) and burst length (4 words) as those for the conventional technique of FIGS. 1A and 1B. The meaning of symbols such as CLK in FIGS. 2A and 2B are the same as those of FIGS. 1A and 1B.

FIG. 2A shows an example of the case in which three consecutive burst writes are performed. A difference between FIG. 2A and FIG. 1A is that firstly, the array time constant (ATC) is shortened in FIG. 2A by three clocks as compared with the case of FIG. 1A. This is because in the present invention, the activation of the memory array is not necessarily performed before burst data is inputted to and outputted from I/O, as in the conventional technique, but it is suffice to perform the activation at a considerably later timing at which write is possible when the last burst data comes to the I/O. Since the ATC is shortened, even if the second write command (ADR) is entered at the subsequent clock timing (t2) at which the first 4 words (clocks) complete, two ATCs (ATC-W1 and ATC-W2) do not overlap. As a result, burst data at the data I/O becomes seamless.

FIG. 2B shows an example of the case in which three consecutive burst reads are performed. In this case too, all bust data is prefetched and thus the ATC can be shortened by three clocks as compared with the case of FIG. 1B. The second read command can be entered at the subsequent clock timing (t6) at which the first 4words (clocks) complete. Accordingly, in this case, the data I/O can perform a seamless operation.

Here, in the case of write, standard specifications require the write enabling (WE) signal to be low at the clock timing at which the address valid (ADV) signal is low, and the output enabling (OE) signal to be high at all times. On the other hand, in the case of read, standard specifications require the WE signal to be high at the clock at which the ADV signal is low, and the OE signal to be low all the time. That is, at the clock at which the ADV signal is low, it is prohibited that both the WE and OE signals are low. The prohibitive combination of signals cannot be used in the operation compliant with standard specifications and thus such a combination can be only by used as a special command. In the present invention, attention is focused on utilizing such a special command.

FIGS. 2A and 2B show the operation in which the special command is used. The first write command (WRITE-1) in FIG. 2A has the same combination of the ADV, WE, and OE signals as that in FIG. 1A, but in the second and third commands (WRITE-2, -3), the WE and OE signals are both low at the clock at which the ADV signal is low. That is, a scheme is adopted in which once a write is entered, an access command with both the WE and OE signals being low is recognized as a write. Also, the first read command (READ-1) in FIG. 2B has the same combination of the ADV, WE, and OE signals as that in FIG. 1B, but in the second and third commands (READ-2, -3), the WE and OE signals are both low at a clock at which the ADV signal is low, and such access is treated as a read. That is, a scheme is adopted in which once a read is entered, an access command with both the WE and OE signals being low is recognized as a read.

When a write is performed followed by another write or when a read is performed followed by another read, it may be thought that the same command as that used for the first write/read should be entered. However, if the same command as that used for the first write/read is used again, the following problem occurs. Specifically, in other standard specifications in memory art, there is an interrupt mode for both write and read. In that mode, it is determined that when a normal write or read command is entered during a burst, the burst is stopped at that point and a burst for the interrupted address starts after a new latency. Therefore, in the interrupt mode, with the scheme in which the same command as that for the first write/read is simply entered, a seamless data I/O operation cannot be achieved. The scheme of the present invention in which the special command is used, on the other hand, can achieve a seamless data I/O operation, even in the interrupt mode.

Figure 1B:
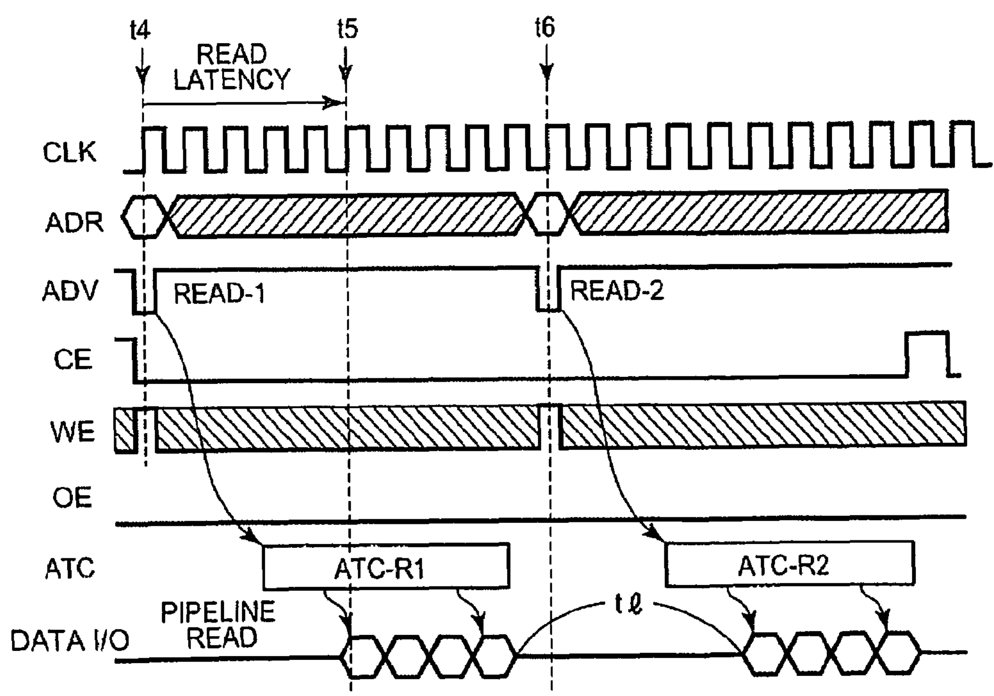
Figure 2A:
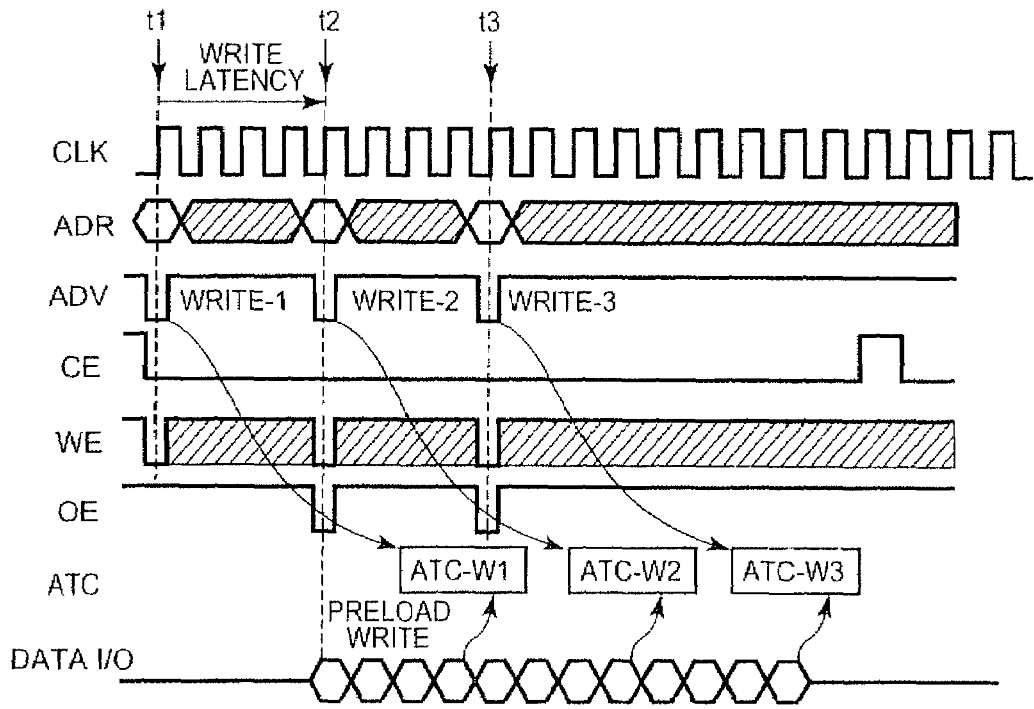
FIGS. 2A and 2B are timing charts showing control operation of the present invention.
Figure 2B:
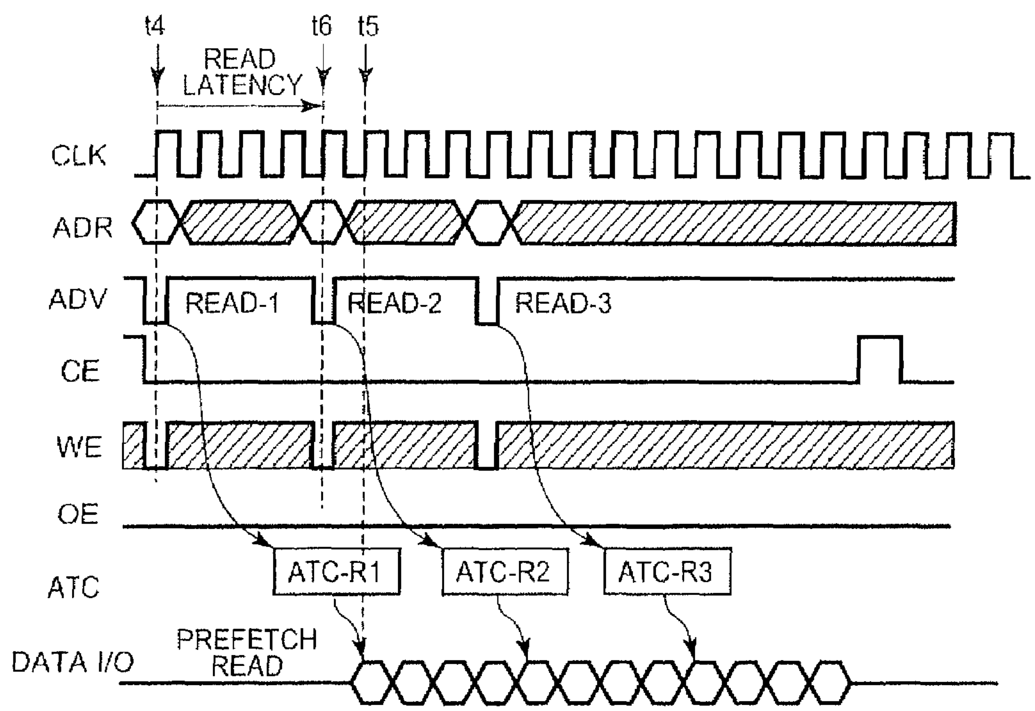

Comparing FIGS. 2A and 2B with FIGS. 1A and 1B, it can be seen that in the present invention a significant improvement in the data rate can be obtained. In the conventional technique of FIGS. 1A and 1B, in both write and read, even if 4-word bursts are repeated a number of times, only four clocks are used out of ten clocks (between t1 and t3) at the data I/O. Thus, the data rate is always only 40% of the maximum data rate which is determined by the clock cycle. On the other hand, in FIGS. 2A and 2B of the present invention, the cycle of the command (ADR) can be made to be four clocks which is the same as the burst length and thus the cycle of the command can be shortened by six clocks as compared with the conventional case of FIGS. 1A and 1B. As a result, in the case of the present invention of FIGS. 2A and 2B, a seamlessness write or read between bursts can be performed. The data rate is always 100% of the maximum data rate which is determined by the clock cycle, which means that the speed is increased by as much as 2.5 times that of the conventional technique.

Figure 3:
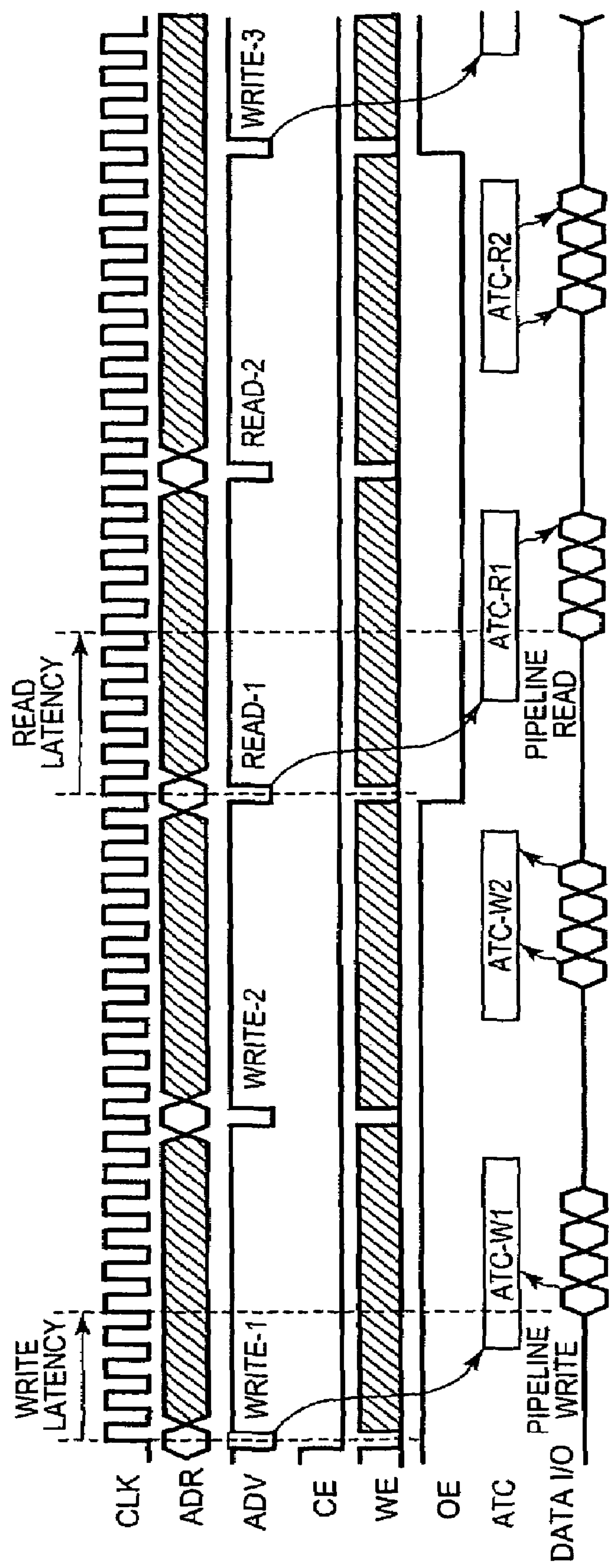
FIG. 3 is a timing chart showing operation in the conventional PSRAM.
Figure 4:
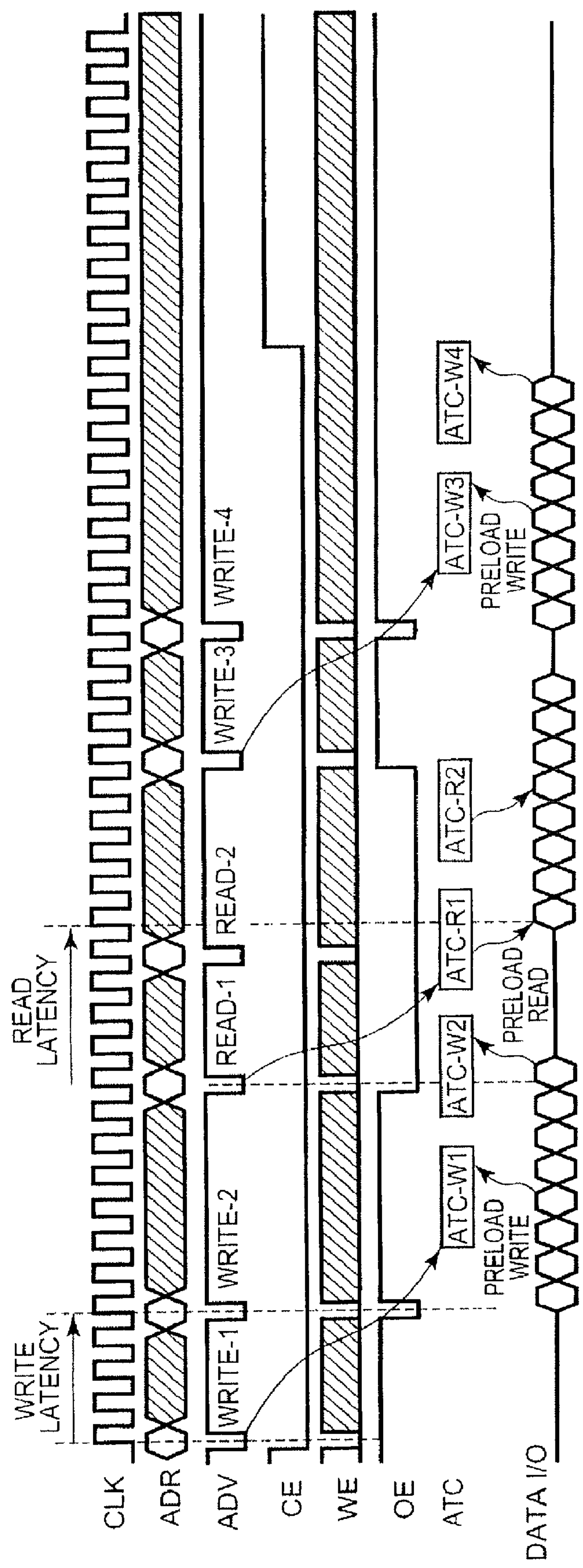
FIG. 4 is a timing chart showing control operation of the present invention.

To switch from a write to a read and vice versa, a command based on the normal standard specifications is used. The operation for this case is described assuming that two writes are performed, followed by two reads, and a timing of the present invention is shown in FIG. 4. For comparison, a timing of the conventional system under the same condition is shown in FIG. 3. The first command (ADR) is a normal write command (WRITE-1) with the WE signal being low and the OE signal being high. The second command has a new combination in which both the WE and OE signals are low. Since the first command is a write command, the second command becomes a write command (WRITE-2) which is the same as the first command. In the third command, when ADV signal is low, the WE signal is high and the OE signal is low and thus the third command becomes a normal read command (READ-1). In the fourth command, by providing a new combination in which both the WE and OE signals are low, since the third command is a read command, the fourth command becomes a read command (READ-2). After the second read (READ-2), by entering a normal command that brings the WE signal to low and the OE signal to high, this command becomes a write command (WRITE-3).

By comparing the operation modes of FIG. 4 with that of the conventional technique of FIG. 3, it becomes apparent that the data rate is significantly improved in the present invention. In FIG. 3, a large interval occurs at the data I/O between all 4-word bursts, i.e., between the write and the write (WRITE-1 and WRITE-2), between the read and the read (READ-1 and READ-2), and at switching from the write to the read (from WRITE-2 to READ-1). In the present invention of FIG. 4, a relatively large interval occurs at the data I/O only during switching from the write to the read (from WRITE-2 to READ-1). During switching from the read to the write (from READ-2 to WRITE-3), there is an interval of only a minimum of one clock. The one-clock interval is provided to prevent a collision between the read and the write at the data I/O. Since there is a large interval between operations of the memory array, when a configuration is used that does not have a collision problem, such as an open drain, an interval of one clock at the data I/O is eliminated, thus seamless data I/O is obtained. Even when a write command is entered one clock earlier, there is seamless data I/O.

In the case of a small number of repetitions of two writes and two reads with a short burst length of 4 words, the average data rate between the commands WRITE-1 and WRITE-3 in the conventional technique is 40% (16/40) of the maximum data rate which is determined by the clock cycle as shown in FIGS. 1A and 1B; however, the average data rate in the present invention is 76% (16/21). In the present invention, the speed is increased by about twice that of the conventional technique. When the burst length is long, such as 8 or 16, or when the number of consecutive writes or reads increases, the data rate of the present invention is further increased and becomes nearly 100%, the maximum data rate which is determined by the clock cycle.

Figure 5:
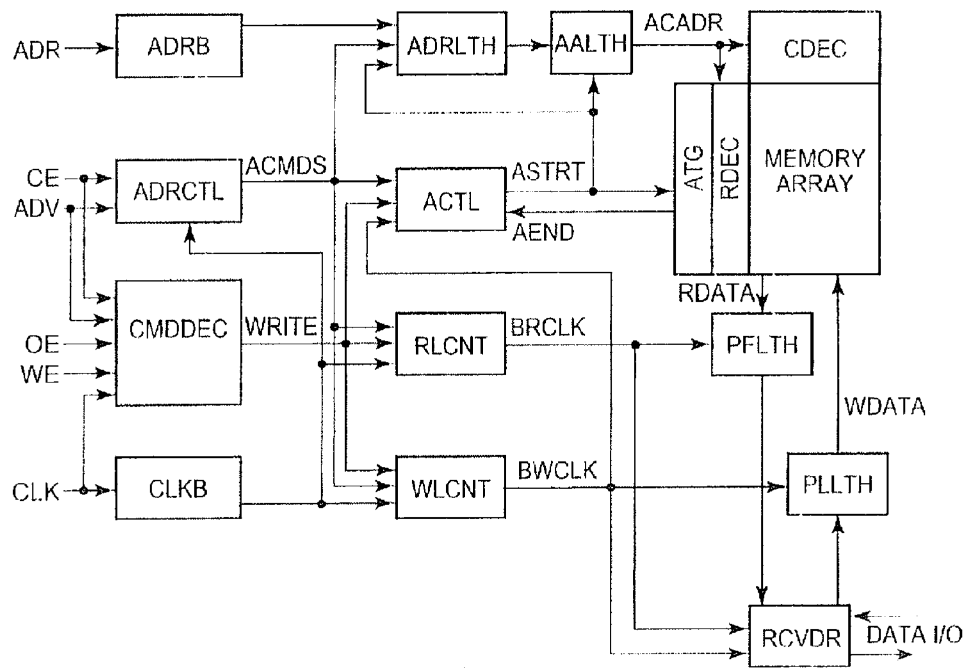
FIG. 5 is a block diagram showing a configuration of a memory of the present invention.

FIG. 5 is a diagram showing an exemplary memory configuration of the present invention. Each block is described below.

ADRB represents address buffers. The ADRB receives address input signals (ADR) from an external source and transfers the address input signals to the internal circuit.

ADRLTH represents address latches. The ADRLTH is a set of circuits that temporarily latch the address input signals (ADR) according to an ACMDS signal which is an access command signal. When the ADR is latched the subsequent address may be inputted before the access to a memory array begins. Hence, the ADRLTH is preferably of a two-stage FIFO type.

AALTH represents access address latches. The AALTH latches a physical access address, according to an ASTRT signal which is a signal for starting access to the memory array. The AALTH supplies an access address as an ACADR signal to row decoders (RDEC) and column decoders (CDEC) of the memory array. AALTH holds the ACADR signal during the access to the memory array.

ADRCTL represents an address control circuit. The ADRCTL recognizes an access time when both a chip enabling (CE) signal and an address valid (ADV) signal are low. Then, the ADRCTL outputs an ACMDS signal which is the access command signal to the ADRLTH and causes the ADRLTH to latch the address. At the same time, the ADRCTL outputs the ACMDS signal to other internal control circuits and thereby informs the internal control circuits of the start of access.

Figure 6:
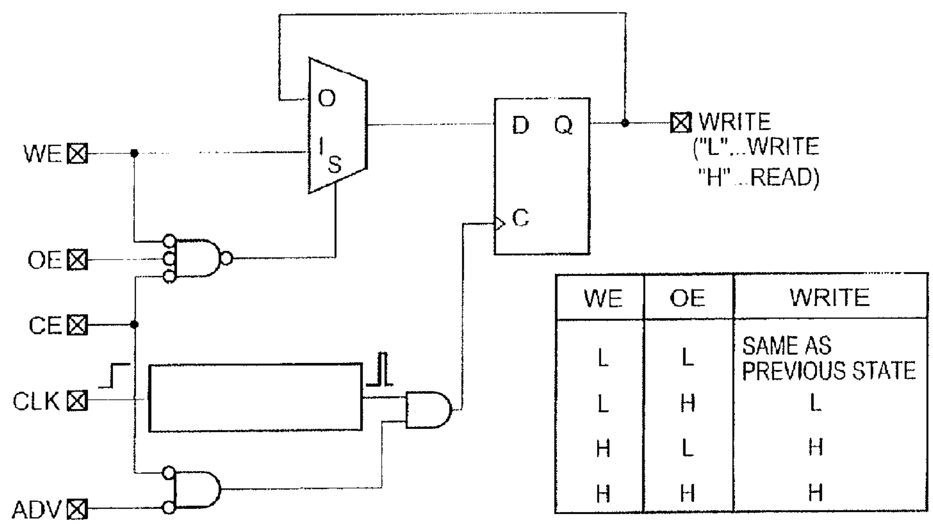
FIG. 6 is a circuit diagram showing a configuration of a command decoder (CMDDEC) of FIG. 5.

CMDDEC represents a command decoder. The CMDDEC functions as a command discriminating circuit that receives an output enabling (OE) signal, a write enabling (WE) signal, and a clock (CLK) signal, in addition to the CE and the ADV signals. CMDDEC outputs a WRITE signal which is a command discriminating signal for specifying the whether the access command signal is for a read or a write operation. FIG. 6 shows a diagram showing an exemplary detailed configuration of the CMDDEC and a truth table. The CMDDEC outputs a signal (high or low) given by the truth table, as a WRITE signal, at a clock timing at which the CE and the ADV signals are low and according to the combination of OE and WE signals. Here, WRITE of low (L) indicates a write and WRITE of high (H) indicates a read. By the configuration such as the one shown in FIG. 6, the requirements of standard specifications where a write is performed with the combination of WE (L) and OE (H) and a read is performed with the combination of WE (H) and OE (L) can be satisfied. In addition, by the combination of WE (L) and OE (L), it is possible to make the command unique to the present invention that keeps the same state (write or read) as the previous state of WRITE (L or H). Note that the configuration of FIG. 6 is merely an example and thus any circuit configuration can be used as long as the configuration satisfies the aforementioned function.

CLKB represents a clock buffer. The CLKB is a circuit that receives a clock signal from an external source and buffers the clock signal, and at the same time, sends the clock signal to other circuits.

ACTL is an access control circuit. The ACTL receives the ACMDS and WRITE signals. When the WRITE signal is high, the ACTL immediately sends an ASTRT (access start) signal for reading to a control circuit (ATG) of the memory array. When the WRITE signal is low (write), the ACTL does not immediately output the ASTRT signal. In that case, the ACTL receives a BWCLK signal from a write latency counter (WLCNT) and then outputs the ASTRT signal to the ATG after an appropriate delay. The ASTRT signal is also outputted to the ADRLTH, and is also used to perform such a control that when two addresses are held in the FIFO that constitutes the ADRLTH, the ASTRT signal controls the first input address to be sent to the AALTH, and when only a single address is held in the FIFO, the ASTRT signal controls that address to be transferred to the AALTH.

ATG represents an array timing generator. The ATG receives the ASTRT signal from the ACTL, and in response thereto, starts accessing the memory array and then generates a series of timing control signals of the memory array, such as activation of a selected word line, driving of a sense amplifier, and precharging. Furthermore, the ATG sends an access end (AEND) signal ("low" for access start and "high" for access end) to the ACTL.

RLCNT represents a read latency counter. The RLCNT receives a read access command (WRITE (L)) and then outputs, after a predetermined latency, a clock signal BRCLK (burst read clock) which synchronizes with the external clock (CLK), for the time duration equal to the burst length.

WLCNT represents a write latency counter. The WLCNT receives a write command (WRITE (H)) and then outputs, after a predetermined latency, a clock signal BWCLK (burst write clock) which synchronizes with the external clock (CLK), for the time duration equal to the burst length.

PFLTH represents prefetch latches. Upon reading, the PFLTH latches data RDATA (read data) for whole burst length at a time and sends the RDATA to RCVDR (receiver & driver) which is a set of data I/O circuits, according to the BRCLK signal.

PLLTH represents preload latches. The PLLTH latches data to be written to the RCVDR from an external source by burst, according to the BWCLK signal. In addition, the PLLTH includes a counter for counting the number of clocks of the BWCLK signal, and buffers for writing all write data WDATA to the memory array at a time after the WDATA for whole burst length has been latched.

The RCVDR represents a data receiver and driver. The RCVDR receives write data from data inputs/outputs (data I/O) and outputs the read data read out of the memory cell to the data I/Os.

A method of controlling access to a memory of the present invention for the case with the configuration of FIG. 5 is described below.

Figure 7:
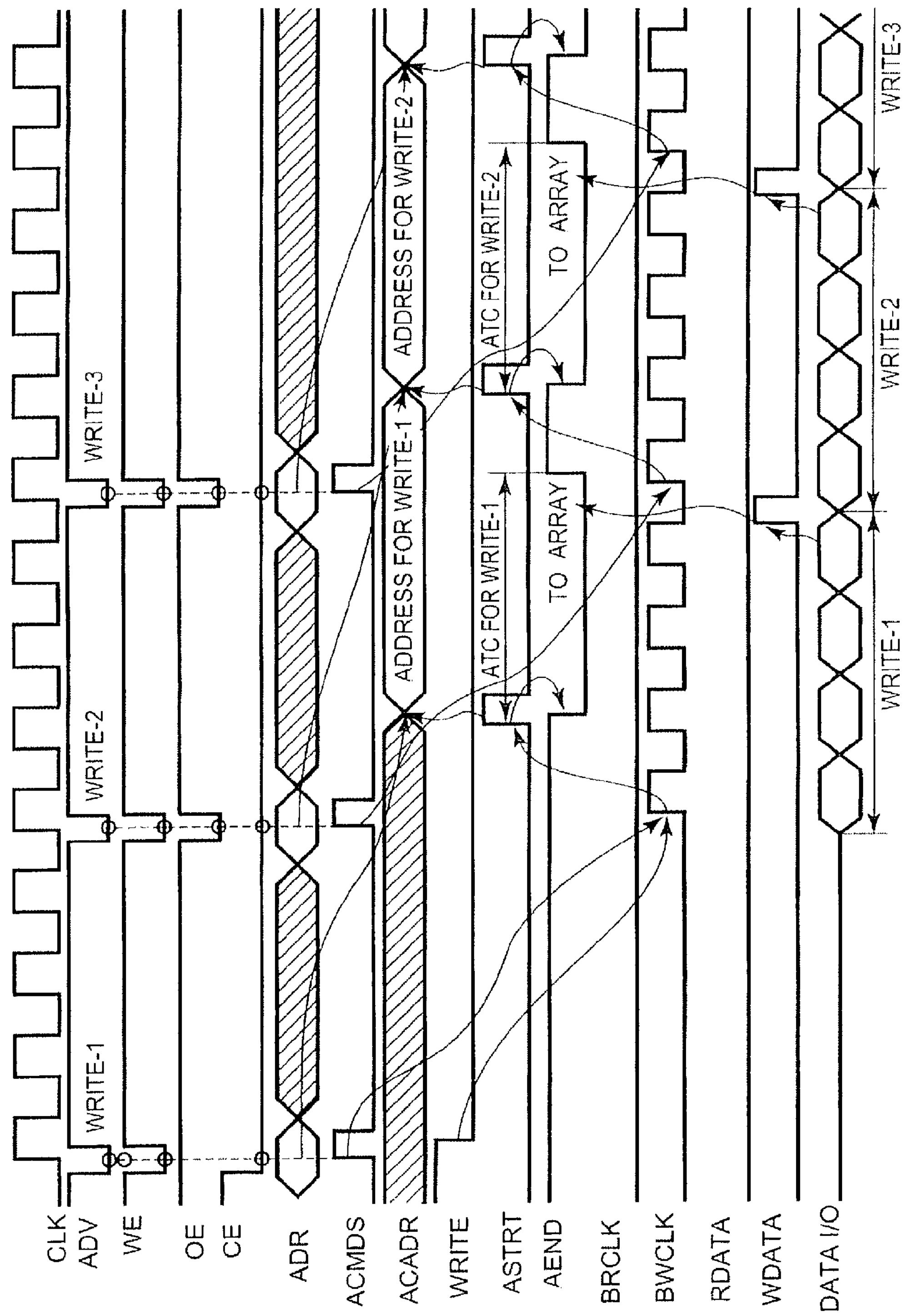
FIG. 7 is a timing chart showing operation of a memory system of FIG. 5 of the present invention.

FIG. 7 is a diagram showing a timing of the operation for three consecutive burst writes shown in FIG. 2A. At a timing of Write-1, both the ADV and CE signals are low, the WE signal is low, and the OE signal is high and thus the WRITE signal is low, so a write operation is started. The WLCNT receives the ACMDS signal of high state and thus starts to count clocks and to output the BWCLK signal after a predetermined latency (four clocks). Concurrently, write data are inputted to the RCVDR from an external source by burst, in synchronization with clocks corresponding to four bits. With the first BWCLK, the write data starts to be transferred to the PLLTH from the RCVDR, and after an appropriate delay, a pulse of the ASTRT signal is outputted from the ACLT and the operation of the memory array begins. At this time, the AEND signal is low. An address for this case is the one latched by the Write-1 command. When the ASTRT signal is asserted, an address for the subsequent Write-2 command is already inputted to the ADRLTH. The address for the Write-1 that is first inputted to the FIFO of the ADRLTH is inputted to the AALTH and used. After a predetermined delay from the fourth clock of the BWCLK at which 4-bit burst data for Write-1 have been inputted, the 4-bit data are written at a time to the memory array from the PLLTH. By this writing, the access to the memory array ends and the AEND signal returns to high. In the Write-2 command, since both the WE and OE signals are low, the CMDDEC allows the WRITE to remain low, not changing the WRITE, and thus a write is performed again in the same manner as that for Write-1.

Figure 8:
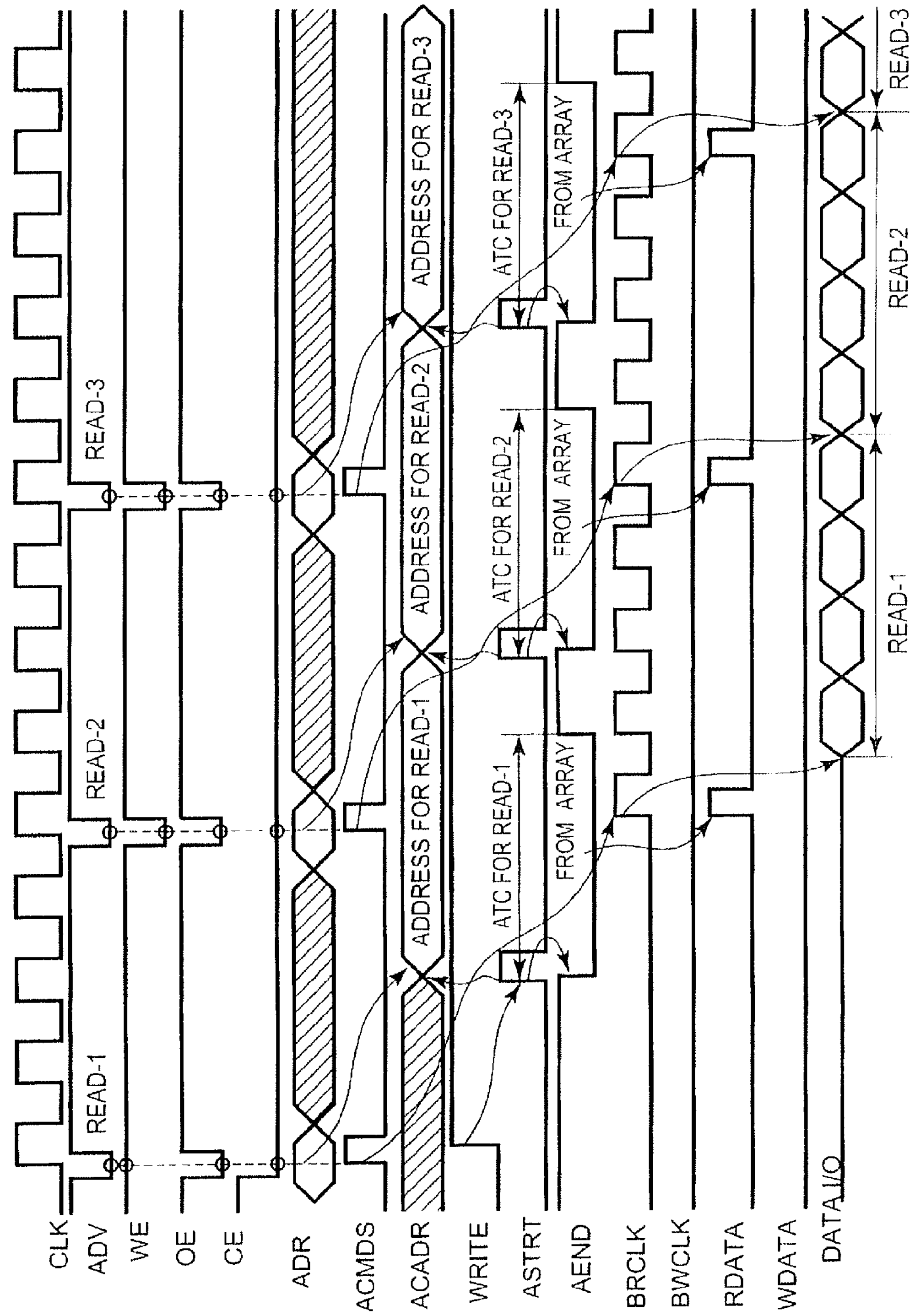
FIG. 8 is a timing chart showing operation of the memory system of FIG. 5 of the present invention.

FIG. 8 is a diagram showing a timing of the operation for three consecutive burst reads shown in FIG. 2B. At a timing of Read-1, both the ADV and CE signals are low, the WE signal is high, and the OE signal is low and thus the WRITE is high, so a read operation is initiated. Here, unlike the write, a pulse (high) immediately appears in the ASTRT signal and an address is transferred to the AALTH from the ADRLTH. Then access to the memory array begins and the AEND signal becomes low. Read access to the memory array proceeds and 4-bit burst data are latched in the PFLTH. BRCLK is outputted as a clock which is one before the fifth clock which is the read latency of external access. Data are sequentially transferred to the RCVDR from the PFLTH and a burst read is performed. The memory array is precharged immediately after the 4-bit burst data are concurrently sent out to the PFLTH. By this, the access to the memory array ends and the AEND returns to high. In a Read-2 command, since both the WE and OE signals are low, the CMDDEC allows the WRITE to remain high, not changing the WRITE, and thus, a read state is obtained again and the same operation as that for Read-1 is performed.

Figure 9:
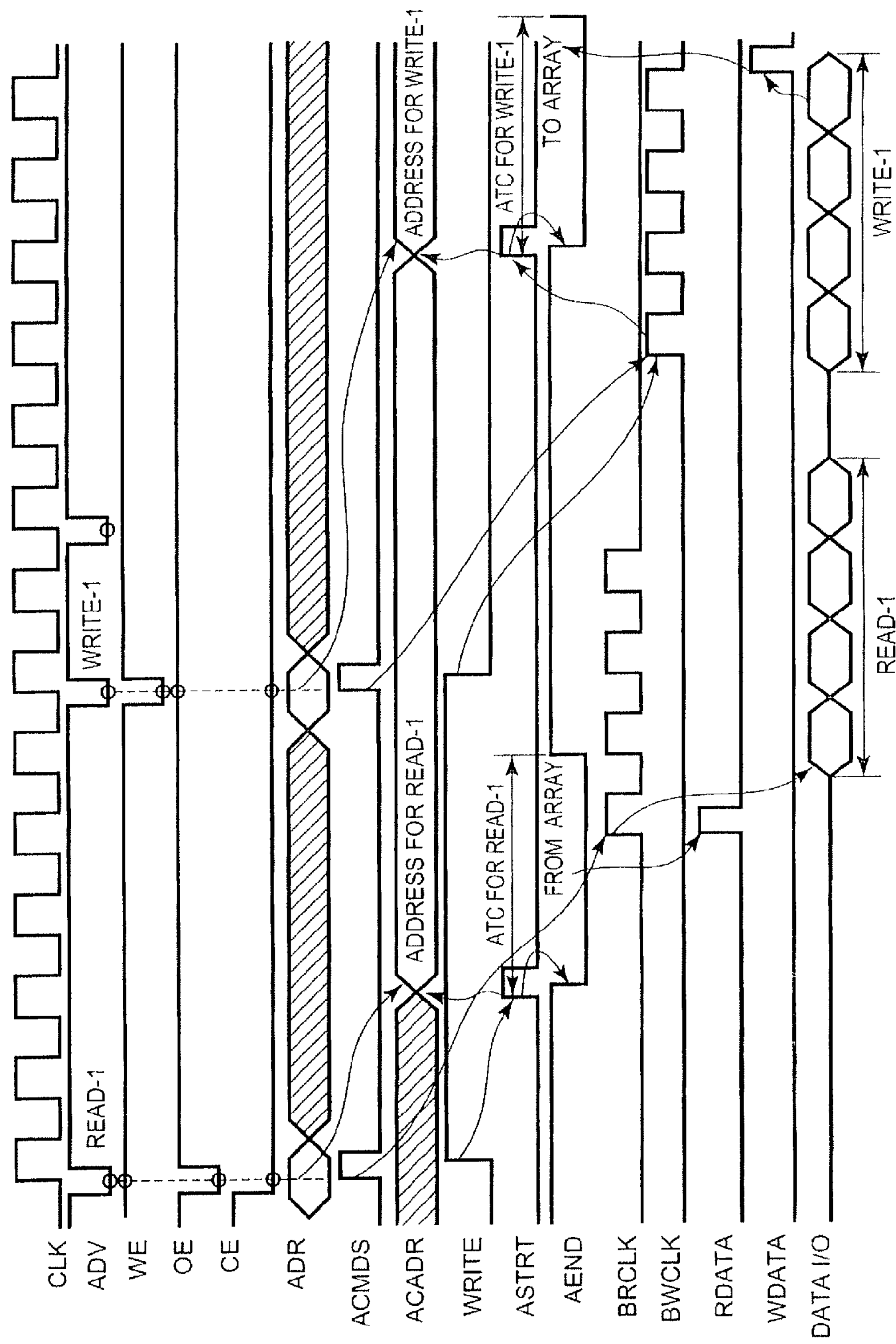
FIG. 9 is a timing chart showing operation of the memory system of FIG. 5 of the present invention.

FIG. 9 is a timing chart showing the operation in which a burst read is performed first, followed by a burst write. The operation of the first read Read-1 is the same as that of the first Read-1 of FIG. 8. In the subsequent Write-1 command, since the WE signal is low and the OE signal is high, the CMDDEC brings the WRITE from high to low and thereby switches the operation mode to write. The operation of Write-1 is the same as that of the first Write-1 of FIG. 7.

Figure 10:
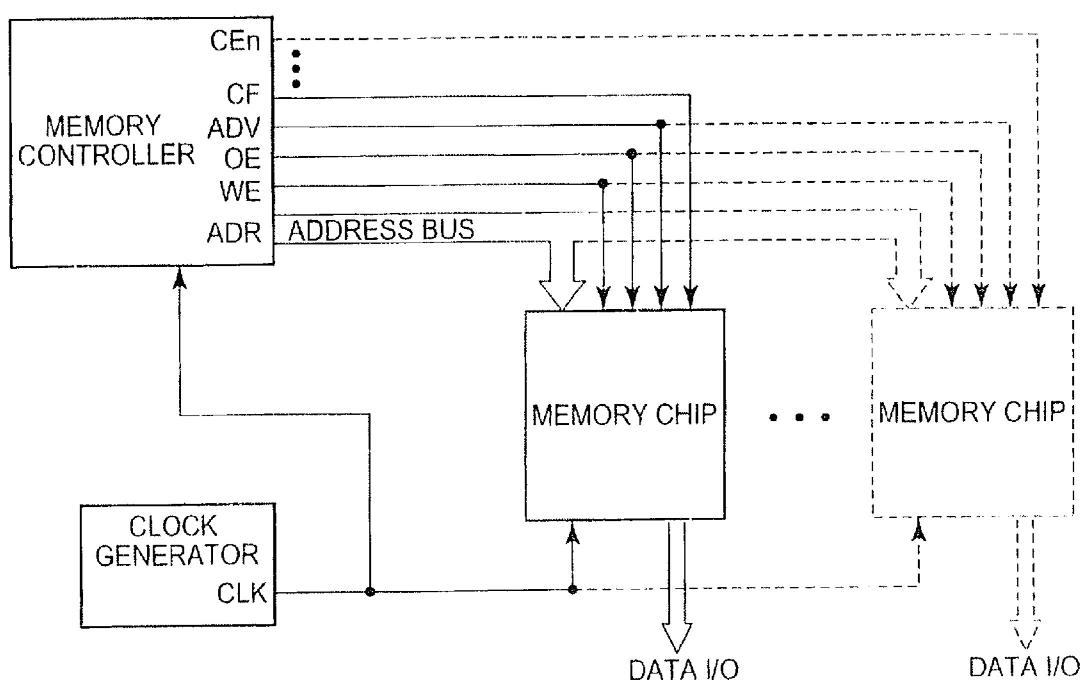
FIG. 10 is a block diagram showing a configuration of a memory system of the present invention.

FIG. 10 is a block diagram showing the configuration of a memory system of the present invention. For the memory system, at least one memory chip is required and the number of memory chips is arbitrarily selected according to the required amount of memory. The memory chip includes a memory of FIG. 5. A memory controller provides signals (CE, ADV, OE, WE, and ADR) to the memory chips. A signal line for providing the CE signal is present per each memory chip. Other signal lines (for ADV, etc.) are shared between the memory chips. A clock generator provides a clock signal (CLK) to the memory controller and the memories (FIG. 5) in the memory chips. Each memory chip is connected to data I/Os.

The present invention is described in the above embodiment, mainly assuming the case of PSRAM which is based on DRAM; however, the present invention is not limited thereto and can be, in principle, applied to various memories having memory cell array structures, including other semiconductor memories.

The invention claimed is:

1. A memory comprising:

a memory array: and an access control circuit for controlling access to said memory array, wherein said access control circuit comprises:

an access command circuit that receives a first and a second input signal and outputs an access command signal enabling commencement of memory access; and a command discriminating circuit that receives said first and second input signals, a third and a fourth input signals, and a clock signal, and that outputs a command discriminating signal for specifying a read or a write access command signal;

said third and fourth input signals comprise an output enabling (OE) signal and a write enabling (WE) signal;

said command discriminating circuit outputs a signal selected from a write signal and a read signal, as said command discriminating signal; wherein said first and second input signals comprise a chip enabling (CE) signal and an address valid (ADV) signal; and said command discriminating circuit outputs a signal selected from said write signal and said read signal at a timing at which said ADV signal changes and according to an active state of said OE signal and said WE signal.

2. The memory according to claim 1, wherein when said OE signal and said WE signal are both in an inactive state (L), said command discriminating circuit outputs a command discriminating signal of the same kind as that of a command discriminating signal at the previous timing.

3. The memory according to claim 2, wherein said command discriminating circuit outputs said write signal when said OE signal is in an active state (H), and outputs said read signal when said WE signal is in an active state (H).

4. A memory provided with a memory cell array, a column decoder, and a row decoder and interconnected with an address input and a data input/output, comprising:

an access command circuit that receives a first and a second input signals and outputs an access command signal informing of commencement of accessing the memory;

a command discriminating circuit that receives said first and second input signals, a third and a fourth input signals, and a clock signal, and that outputs a command discriminating signal for specifying a read or a write access command signal;

an address latching circuit that, according to said access command signal, latches an address signal input from the address input;

an access address latching circuit that receives the address signal outputted from the address latching circuit and outputs an access address to be accessed to the column decoder and the row decoder;

a prefetch latching circuit that latches read-data read from the memory cell array;

a preload latching circuit that latches write-data inputted from the data input/output; and a control circuit that receives said access command signal and said command discriminating signal and outputs an access start signal for accessing said access address of said memory cell away and said access address latching circuit.

5. The memory according to claim 4, further comprising a timing circuit that receives said access start signal and controls timing for activating a memory cell corresponding to said access address.

6. The memory according to claim 5, further comprising a read latency counter for receiving the clock signal, said access command signal, and said command discriminating signal and outputting to said prefetch latching circuit a read clock signal with a predetermined length which synchronizes with said clock signal.

7. The memory according to claim 6, further comprising a write latency counter for receiving the clock signal, said access command signal, and said command discriminating signal and outputting to said preload latching circuit a write clock signal with a predetermined length which synchronizes with said clock signal.

8. The memory according to claim 7, further comprising a receiver/driver circuit that receives read data from said prefetch latching circuit and outputs said read data to said data input/output according to said read clock signal, and that receives write data from said data input/output and outputs said write data to said preload latching circuit according to said write clock signal.

9. The memory according to claim 4, wherein said third and fourth input signals comprise an output enabling (OE) signal and a write enabling (WE) signal; and said command discriminating circuit outputs a write signal or a read signal, as said command discriminating signal.

10. The memory according to claim 9, wherein said first and second input signals comprise a chip enabling (CE) signal and an address valid (ADV) signal; and said command discriminating circuit outputs a signal selected from said write signal and said read signal at a timing at which said ADV signal changes and according to an active state of said OE signal and said WE signal.

11. The memory according to claim 10, wherein when said OE signal and said WE signal are both in an inactive state (L), said command discriminating circuit outputs a command discriminating signal which is the same as that of a command discriminating signal at the previous timing.

12. The memory according to claim 11, wherein said command discriminating circuit outputs said write signal when said OE signal is in an active state (H), and outputs said read signal when said WE signal is in an active state (H).

13. The memory according to claim 1 further comprising:

a memory controller that generates said first, second, third, and fourth input signals and outputs said first, second, third, and fourth input signals to said memory; and a clock generator that generates said clock signal and outputs said clock signal to said memory.

14. The memory according to claim 4 further comprising:

a memory controller that generates said first, second, third, and fourth input signals and outputs said first, second, third, and fourth input signals to said memory; and a clock generator that generates said clock signal and outputs said clock signal to said memory.

15. A method of controlling access to a memory, comprising the steps of:

generating an access command (ACMDS) signal for informing of the access to the memory according to a chip enabling (CE) signal and an address valid (ADV) signal; and generating a command discriminating (CDN) signal for specifying a kind of said access command signal according to said CE signal, said ADV signal, an output enabling (OE) signal, and a write enabling (WE) signal;

wherein in said step of generating the CDN signal, a write signal or a read signal is generated at a timing at which said ADV signal changes and according to an active state of said OE signal and said WE signal.

16. The method according to claim 15, wherein in said step of generating the CDN signal, when said OE signal and said WE signal are both in an inactivate state (L), a command discriminating signal of the same kind as that of a command discriminating signal at the previous timing.

17. The method according to claim 15, wherein in said step of generating the CDN signal, when said OE signal is in an active state (H), said write signal is generated and when said WE signal is in an active state (H), said read signal is generated.

* * * * *